(12) United States Patent
Kimura

(10) Patent No.: US 8,111,381 B2
(45) Date of Patent: Feb. 7, 2012

(54) POSITIONING APPARATUS, EXPOSURE APPARATUS AND DEVICE MANUFACTURING METHOD

(75) Inventor: Atsushi Kimura, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 633 days.

(21) Appl. No.: 12/241,664

(22) Filed: Sep. 30, 2008

(65) Prior Publication Data
US 2009/0091724 A1   Apr. 9, 2009

(30) Foreign Application Priority Data
Oct. 4, 2007   (JP) .................. 2007-261247

(51) Int. Cl.
G03B 27/58  (2006.01)
G03B 27/64  (2006.01)

(52) U.S. Cl. .......................... 355/72; 355/75
(58) Field of Classification Search ............ 355/72–76; 310/10, 12; 318/135; 378/34, 35
See application file for complete search history.

(56) References Cited

U.S. PATENT DOCUMENTS

| | | | | |
|---|---|---|---|---|
| 4,654,571 A * | 3/1987 | Hinds | | 318/687 |
| 5,684,856 A * | 11/1997 | Itoh et al. | | 378/34 |
| 7,064,512 B2 | 6/2006 | Kimura | | 318/649 |
| 7,144,160 B2 | 12/2006 | Kimura | | 384/12 |
| 7,336,344 B2 | 2/2008 | Kimura | | 355/75 |
| 2007/0013895 A1* | 1/2007 | Okada | | 355/72 |
| 2008/0074635 A1 | 3/2008 | Kimura | | 355/75 |

FOREIGN PATENT DOCUMENTS

| JP | 2000-16199 | 1/2000 |
|---|---|---|
| JP | 2006-318698 | 11/2006 |

OTHER PUBLICATIONS

English Translation of JP 2000-16199.
English Translation of JP 2006-318698.

* cited by examiner

*Primary Examiner* — Hung Henry Nguyen
(74) *Attorney, Agent, or Firm* — Fitzpatrick, Cella, Harper & Scinto

(57) ABSTRACT

A positioning apparatus includes a stage movable on a base, an actuator which drives the stage and a driver which supplies current to the actuator. The apparatus further includes a current supply path having a plurality of parallel paths connecting the driver and the actuator. The current supply path includes a plurality of forward electrical wires and a plurality of backward electrical wires. The apparatus also includes a detector which detects a break of the current supply path based on a current of at least one of the plurality of parallel paths. The detector detects a break of the current supply path based on a total current of at least one of the plurality of forward electrical wires and at least one of the plurality of backward electrical wires.

16 Claims, 9 Drawing Sheets

POSITIONING APPARATUS, EXPOSURE APPARATUS AND DEVICE MANUFACTURING METHOD

This application claims the benefit of Japanese Patent Application No. 2007-261247, filed Oct. 4, 2007, which is hereby incorporated by reference herein in its entirety.

BACKGROUND OF THE INVENTION

1. Field of the Invention

The present invention relates to a positioning apparatus, an exposure apparatus, and a device manufacturing method, which are used in a process for manufacturing semiconductor devices and liquid crystal display devices.

2. Description of the Related Art

Figure 8:
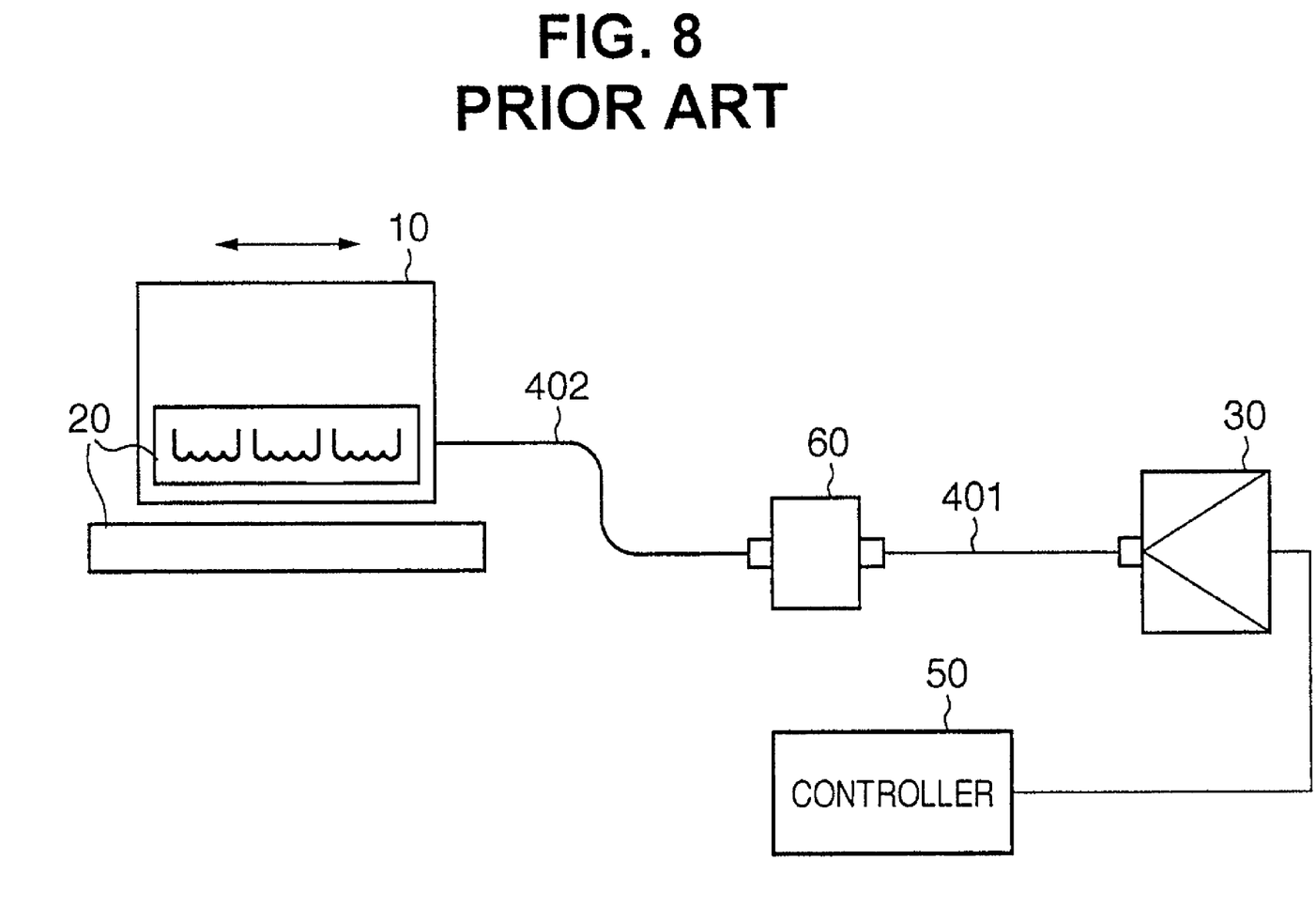
FIG. 8 is a view showing the arrangement of a conventional positioning apparatus.

FIG. 8 is a view showing the arrangement of a positioning apparatus used in a conventional exposure apparatus.

Reference numeral 10 denotes a stage movable on a base; reference numeral 20, an actuator for positioning the stage 10; reference numeral 30, a driver for supplying current to the actuator 20; and reference numerals 401 and 402, electrical wires serving as current supply paths. Reference numeral 50 denotes a controller for performing servo control to position the stage 10 at a desired position.

The controller 50 outputs the target current value of the actuator 20 to the driver 30 based on a difference between the target position and positional information from a position detector (not shown) arranged on the stage 10. The driver 30 has a current control circuit (not shown) and controls operation so that a current output follows the input target current value.

The actuator 20 is classified into two types. The first type is a moving coil type, the motor coil portion of which is arranged in its stage 10, that is, a movable portion. The second type is a moving magnet type, the motor coil portion of which is arranged in a stationary portion, and which has a stage 10 that includes a magnet portion and does not receive current. In the moving coil type, electrical wires 401 and 402 connect the movable and stationary portions. For example, in FIG. 8, the electric wire 401 is a stationary electrical wire, while the electrical wire 402 connects the movable portion and the stationary electrical wire 401. The electrical wire 402 is bent or slid upon movement of the movable portion.

When an abnormality has occurred in servo control of the controller 50 for the stage 10, the stage 10 must stop urgently. If it is impossible to interrupt the servo control, a braking circuit 60 must apply a brake to the stage 10 using a non-servo control system. It is a common practice to employ a technique for applying a braking force to the stage 10 by generating a motor coil current which serves as a braking force of the stage 10 upon short-circuiting of the motor coil. This braking circuit 60 is a high-voltage, large-current circuit, resulting in a large circuit board. In either the moving coil scheme or the moving magnet scheme, the braking circuit 60 is often arranged in the stationary portion.

The electrical wires 401 and 402 may break due to degradation over time, and operation errors may arise in a maintenance operation. Particularly, the movable wiring portion of the moving coil motor is susceptible to degradation in strength due to repeated sliding and bending. The actuator 20 often has a plurality of motor coils for an increase in thrust and the number of axes. When one of the plurality of electrical wires or the electrical wires partially break, the braking force of the motor lowers.

In addition, if the electrical wire between the braking circuit 60 and the motor coil portion breaks, a braking current, generated by a counter-electromotive force upon short-circuiting of the coil, does not flow. As a result, the braking force lowers.

When the stage braking force lowers to increase a braking distance upon occurrence of an abnormality, the stage 10 may contact a neighboring structure at a high probability, and this leads to damage to the components in the neighboring structure and the stage 10.

There are available a scheme (see Japanese Patent Laid-Open No. 2000-16199) for detecting a break by inserting a break detection line in the outer shell of the electrical wire portion that is most likely to contact the neighboring structure and break, and a scheme (Japanese Patent Laid-Open No. 2006-318698) using a break prediction signal line more susceptible to a break than the neighboring electrical wires. It is, however, difficult to specify that specific portion of the movable wiring portion that sustains repeating bending and sliding, on which a largest stress load acts. It is not always the case that the detection line breaks first.

SUMMARY OF THE INVENTION

It is an object of the present invention to provide a positioning apparatus capable of reliably and simply detecting a break of a current supply path to an actuator for driving a table.

The present invention, according to one aspect, provides a positioning apparatus comprising a stage movable on a base, an actuator which drives the stage, a driver which supplies current to the actuator, a current supply path having a plurality of parallel paths connecting the driver and the actuator, and a detector which detects a break of the current supply path based on a current of at least one of the plurality of parallel paths.

Further features of the present invention will become apparent from the following description of exemplary embodiments with reference to the attached drawings.

DESCRIPTION OF THE EMBODIMENTS

Various exemplary embodiments, features, and aspects of the present invention will be described in detail below with reference to the drawings.

First Embodiment

Figure 1:
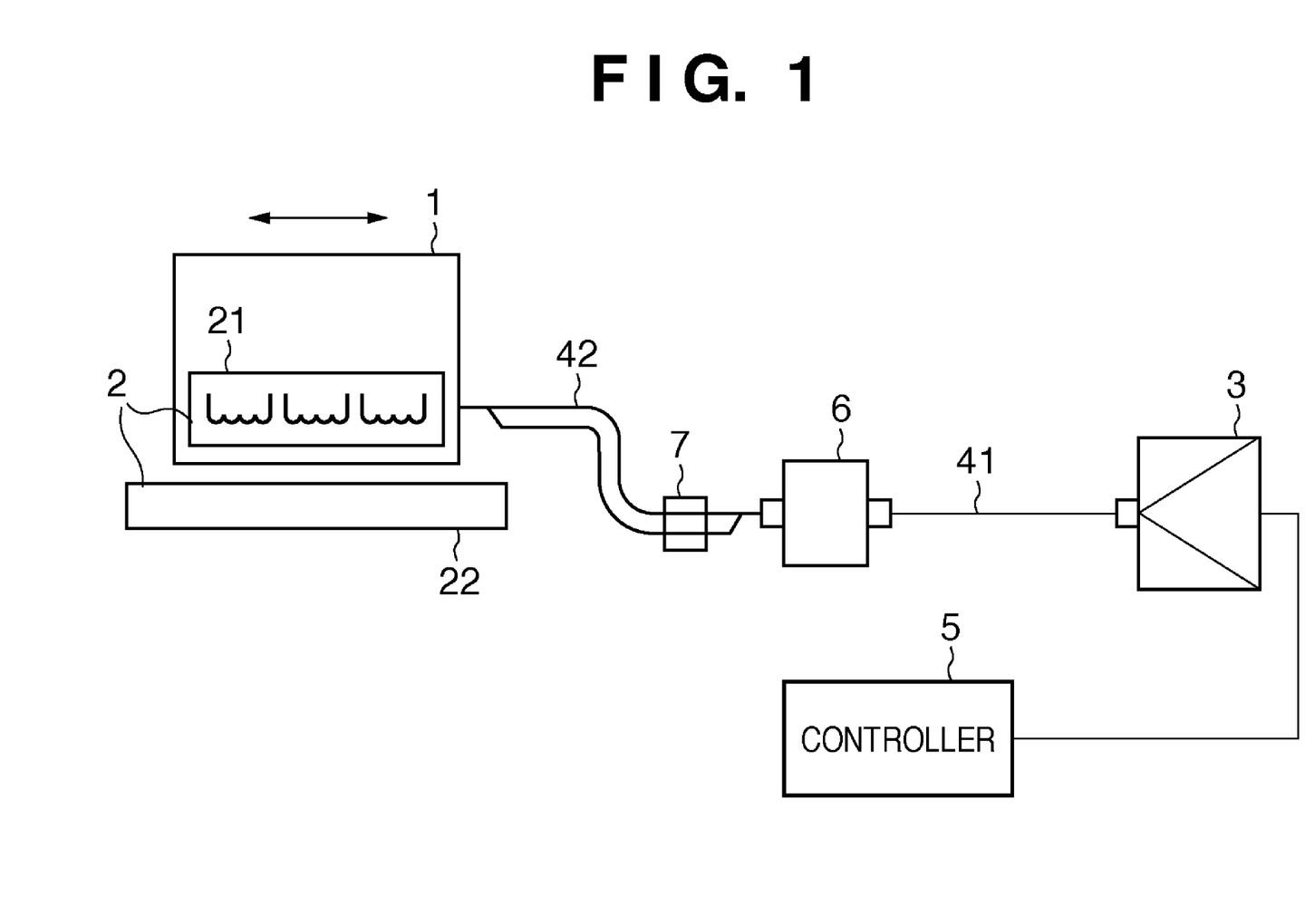
FIG. 1 is a view showing the arrangement of a positioning apparatus of an embodiment.

FIG. 1 is a view showing the arrangement of a positioning apparatus according to the first embodiment.

Reference numeral 1 denotes a stage that is movable on a base; and reference numeral 2, an actuator that drives the stage 1 so as to position the stage 1. The actuator 2 includes a movable element 21 arranged on the stage 1 and a stator 22 fixed on the base. This structure employs a moving coil motor, in which the motor coils are mounted on the movable element 21.

Reference numeral 3 denotes a driver for supplying current to the actuator 2; and reference numerals 41 and 42, first and second electrical wires serving as current supply paths. The second electrical wire 42 is connected between the movable portion (i.e., the stage 1) and the stationary portion. The second electrical wire 42 frequently repeats bending and sliding upon movement of the stage 1. Reference numeral 5 denotes a controller for performing servo control to position the stage 1 at a desired position.

In this embodiment, the second electrical wire 42 is branched into two paths midway along. More specifically, the second electrical wire 42 has a plurality of routes. A current detection board 7 is arranged in the branched portion of the second electrical wire 42. A braking circuit 6 is arranged between the first electrical wire 41 and the second electrical wire 42. When the controller 5 cannot continue servo control due to some reason and the stage 1 must stop urgently, the motor coil of the movable element 21 is short-circuited to generate a counter-electromotive force by electromagnetic induction, thereby, generating a current and hence, a braking force.

Figure 2:
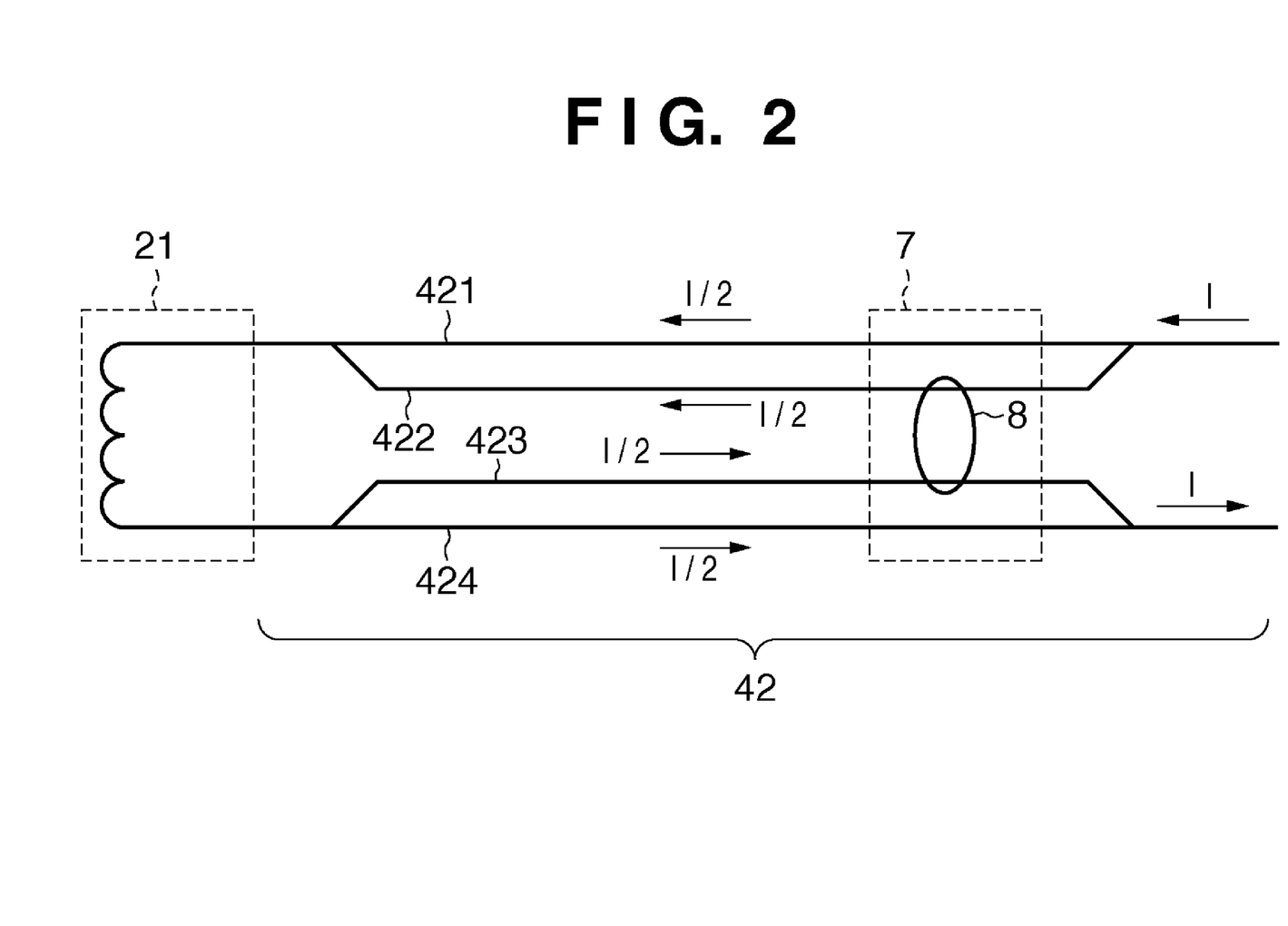
FIG. 2 is a schematic view of a portion including a motor coil, a second electrical wire, and a current detection board in a positioning apparatus of the first embodiment.
Figure 3:
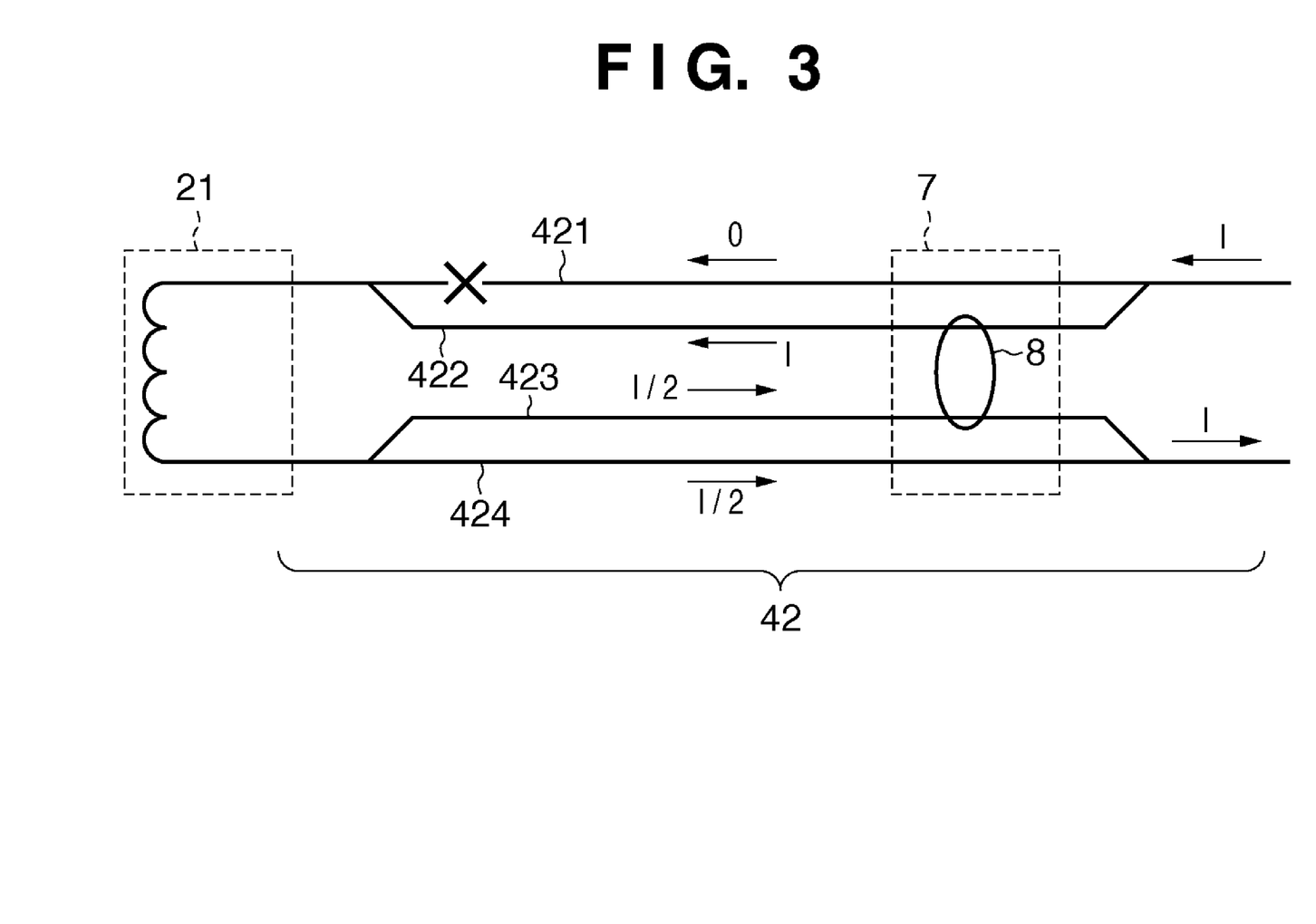
FIG. 3 is a view showing an example when the first forward electrical line in the first embodiment breaks.
Figure 4:
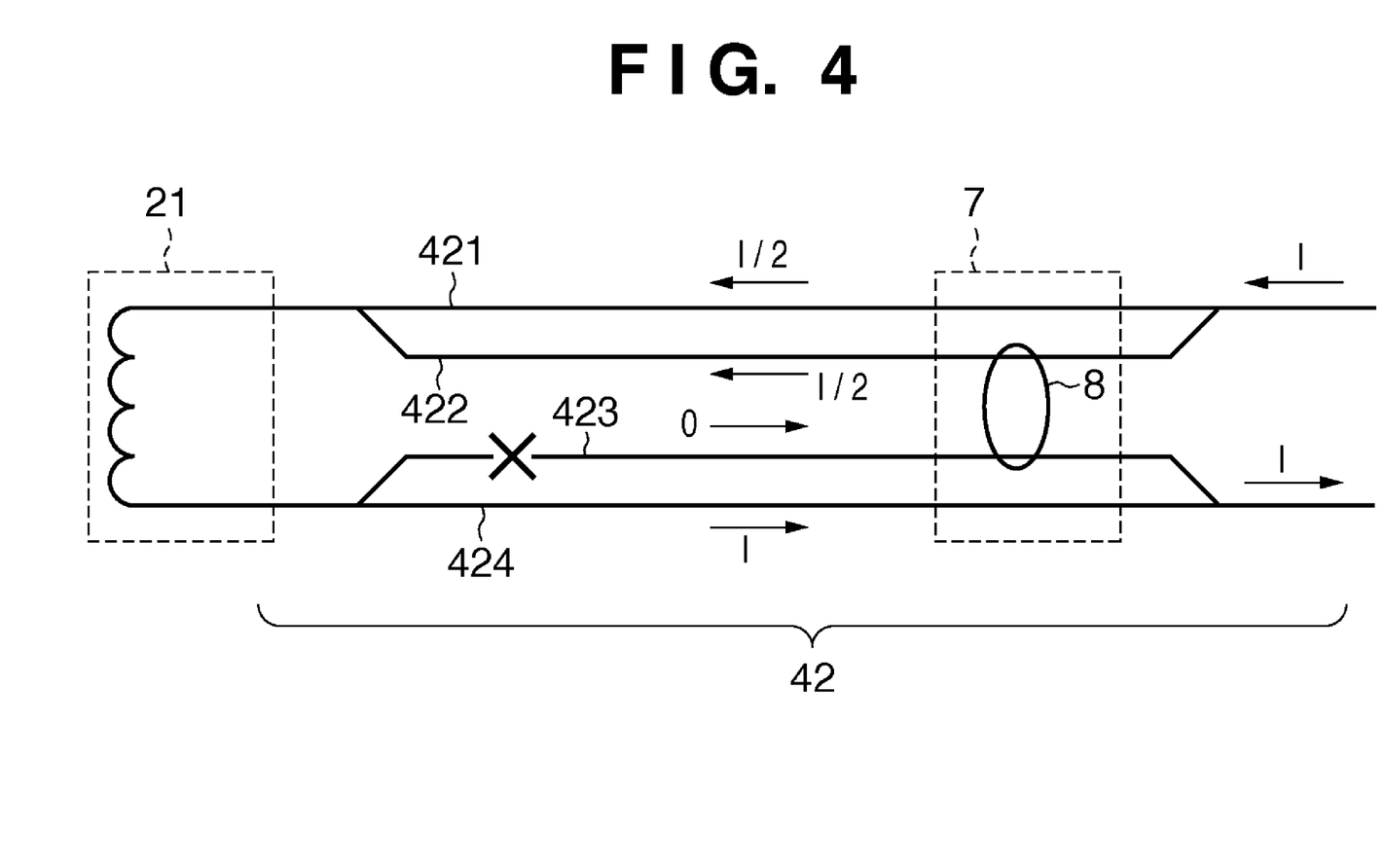
FIG. 4 is a view showing an example when the first backward electrical line in the first embodiment breaks.

The actuator 2 in this embodiment comprises a single-phase coil motor. FIGS. 2, 3, and 4 are schematic views showing the portion including the motor coil, the second electrical wire 42, and the current detection board 7. Midway along the second electrical wire 42, the forward path is branched into a first forward electrical wire 421 and a second forward electrical wire 422, and the backward path is also branched into a first backward electrical wire 423 and a second backward electrical wire 424. The electrical wires 421 to 424 have the same electrical resistance in all paths. When a current I flows in the second electrical wire 42, a current I/2 flows in each of the electrical wires 421 to 424.

With the above arrangement, even if the first forward electrical wire 421 breaks, as shown in FIG. 3, the current I can flow through the second forward electrical wire 422 to continuously supply the current to the motor coil. This allows braking of the stage 1. This also applies to the case in which the second forward electrical wire 422 breaks, or either the first backward electrical wire 423 or the second backward electrical wire 424 breaks, as shown in FIG. 4.

As shown in FIGS. 2, 3, and 4, the electrical detection board 7 is arranged midway along the branched portions. The current detection board 7 includes a current detector 8 serving as a detection portion for obtaining a total current value of the second forward electrical wire 422 and the first backward electrical wire 423 using a Hall element and a current measurement amplifier.

When no break occurs, as shown in FIG. 2, the total current value detected by the current detector 8 is $I/2-I/2=0$. However, when the first forward electrical wire 421 breaks, as shown in FIG. 3, the current I flows in the second forward electrical wire 422, and the current I/2 is kept supplied to the first backward electrical wire 423. The total current value is $I-I/2=I/2$.

When the first backward electrical wire 423 breaks, as shown in FIG. 4, the current I/2 flows in the second forward electrical wire 422, but the current flowing in the first backward electrical wire 423 is zero. The total current value is $I/2-0=I/2$. This also applies to the case in which the second forward electrical wire 422 or the second backward electrical wire 424 breaks.

As described above, the total current values in the normal operation and in the operation upon an occurrence of a break, which are detected by the current detector 8, are different from each other. This makes it possible to detect the presence/absence of a break in accordance with the total current value detected by the current detector 8.

According to this embodiment, even if a break occurs in one of the two paths, each having branched paths, the current can be continuously supplied to the motor coil portion of the actuator 2. This makes it possible to apply a brake to the stage 1 and safely stop it. Even if the current paths are redundant, current detectors 8 need not be prepared for the number of systems, thereby minimizing an increase in circuit scale. Upon detection of a break, the controller informs a host system for controlling the exposure system of the occurrence of the break. Therefore, the apparatus sequence can stop, and replacement of the components can be performed.

Second Embodiment

The second embodiment of the present invention will be described below. The arrangement of a positioning apparatus of this embodiment complies with that shown in FIG. 1, except that a movable element 21 of an actuator 2 comprises a star-connected three-phase motor.

Figure 5:
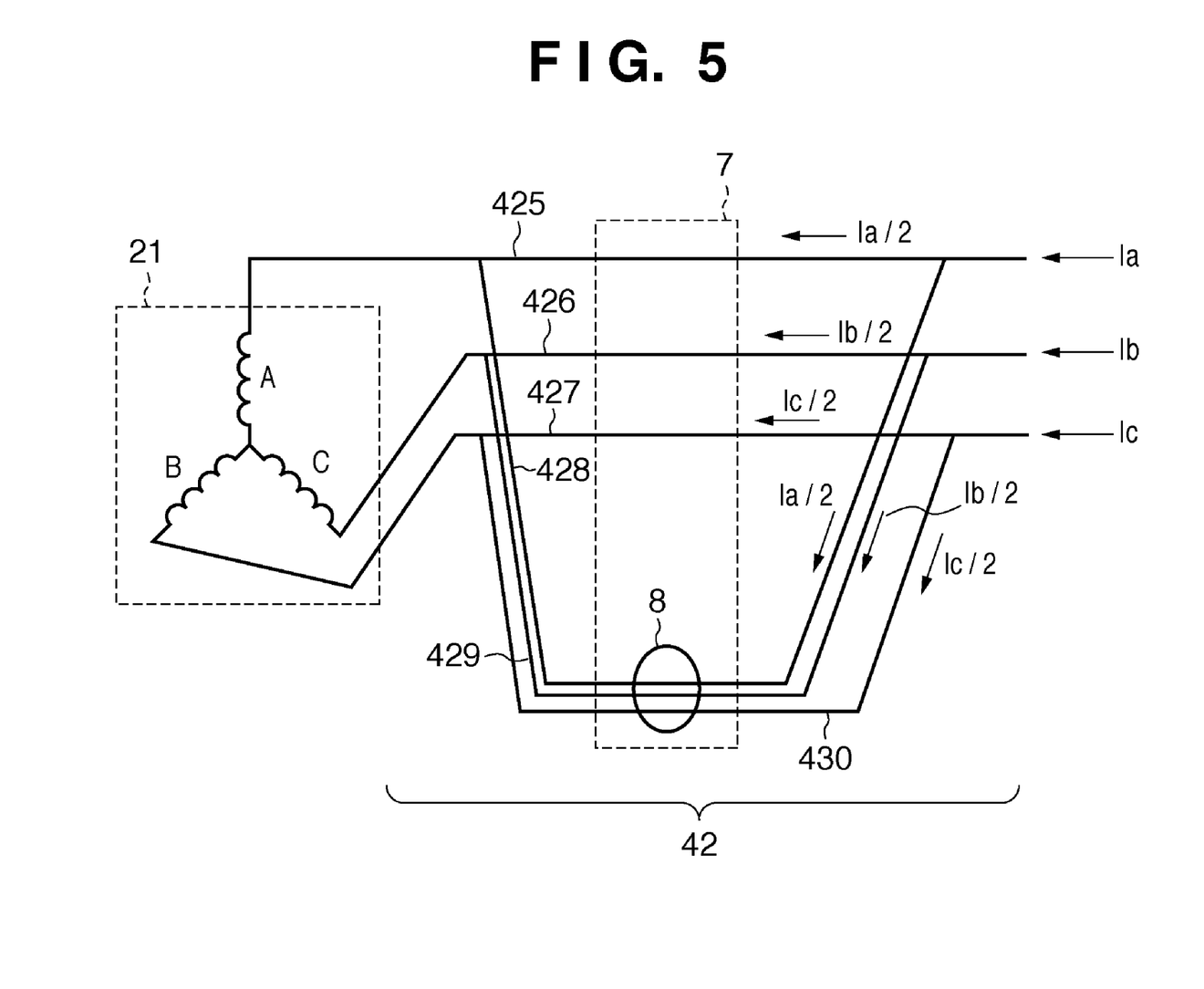
FIG. 5 is a schematic view of a portion including a motor coil, a second electrical wire, and a current detection board in a positioning apparatus of the second embodiment.
Figure 6:
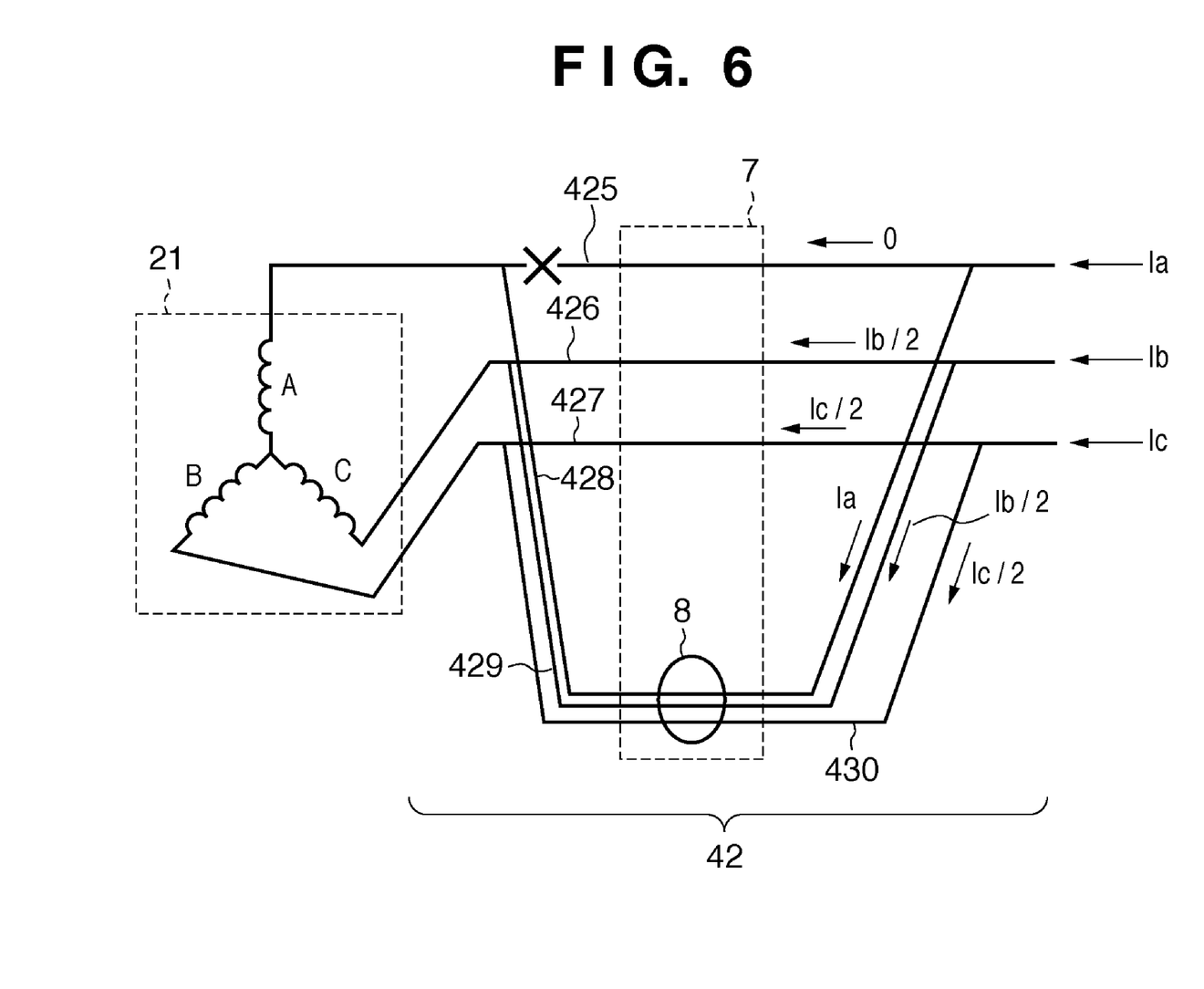
FIG. 6 is a view showing an example when the first forward electrical line in the second embodiment breaks.
Figure 7:
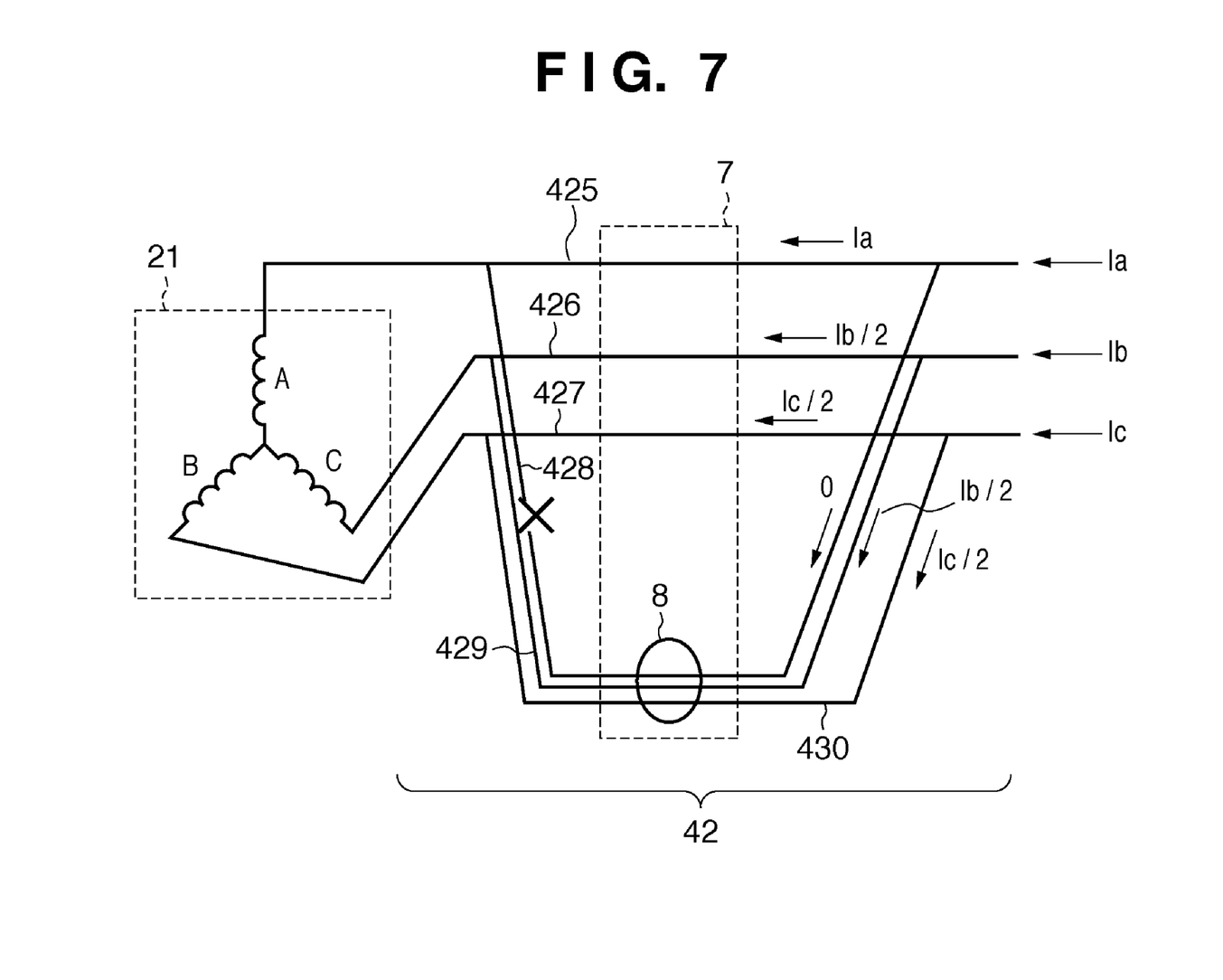
FIG. 7 is a view showing an example when the first backward electrical line in the second embodiment breaks.

FIGS. 5, 6, and 7 are schematic views showing a portion including the motor coil, a second electrical wire 42, and a current detection board 7. The second electrical wire 42 is branched into two paths for each phase midway along. The coils are defined as A-, B-, and C-phase coils. The respective phase motor coils and a driver 3 are connected via the three electrical wires. Each of the three electrical wires includes a plurality of paths. More specifically, the electrical wire for supplying current to the A-phase coil comprises a first A-phase electric wire 425 and a second A-phase electric wire 428. The electrical wire for supplying current to the C-phase coil comprises a first C-phase electrical wire 426 and a second C-phase electrical wire 429. The electrical wire for supplying a current to the B-phase coil comprises a first B-phase electrical wire 427 and a second B-phase electrical wire 430. The electrical wires 425 to 430 have almost the same electrical resistance in all the paths. Letting Ia be the total current flowing through the A-phase coil, Ib be the total current flowing through the B-phase coil, and Ic be the total current flowing through the C-phase coil, a current that is ½ the total current flows through each branched path. $Ia+Ib+Ic=0$.

With the above arrangement, as shown in FIG. 6, even if the first A-phase electrical wire 425 breaks, the current Ia can flow through the second A-phase electrical wire 428 to continuously supply the current to the motor coil. This allows braking of the stage 1. This also applies to the case in which one of the remaining electrical wires 426 to 430 breaks.

In FIGS. 5, 6, and 7, the electrical detection board 7 is arranged midway along the branched portions. The current detection board 7 includes a current detector 8 for obtaining a total current value of the paths each selected from a corresponding one of the three electrical wires using an element such as a Hall element and a current measurement amplifier. In the illustrated embodiment, the current detector 8 detects the total current value of the second A-phase electrical wire 428, the second C-phase electrical wire 429, and the second B-phase electrical wire 430.

When no break occurs, as shown in FIG. 5, the total current value detected by the current detector 8 is $Ia/2+Ib/2+Ic/2=0$. However, as shown in FIG. 6, when the first A-phase electrical wire 425 breaks, the total current value is $Ia+Ib/2+Ic/2=Ia/2$ because the current Ia flows though the second A-phase electrical wire 428.

When the second A-phase electrical wire 428 breaks, as shown in FIG. 7, the current Ia flows through the first A-phase electrical wire 425, and the value of the current flowing through the first A-phase electrical wire 428 becomes zero. The total current value is $Ib/2+Ic/2$. This also applies to the case in which one of the remaining electrical wires 426, 427, 429, and 430 breaks.

As in the first embodiment, as described above, the total current values in the normal operation and in the operation upon an occurrence of a break, which are detected by the current detector 8, are different from each other. This makes it possible to detect the presence/absence of a break in accordance with the total current value detected by the current detector 8.

According to this embodiment, as in the first embodiment, even if a break occurs in one of the two paths, each having branched paths, the current can be continuously supplied to the motor coil portion of the actuator 2. This makes it possible to apply a brake to the stage 1 and safely stop it. Even if the current paths are redundant, current detectors 8 need not be prepared for the number of systems, thereby minimizing an increase in circuit scale. Upon detection of a break, the controller informs a host system for controlling the exposure system of the occurrence of the break. Therefore, the apparatus sequence can stop, and replacement of components can be performed.

In the first and second embodiments described above, the second electrical wire 42 is branched into two paths. If the number of path is three or more, the same effect as described above can be obtained. If an electrical wire serving as a current supply path to an actuator is branched into n paths, a current in at least one of the n paths is monitored to detect a break.

Third Embodiment

An exemplary exposure apparatus to which the positioning apparatus of the present invention is applied will now be described below.

Figure 9:
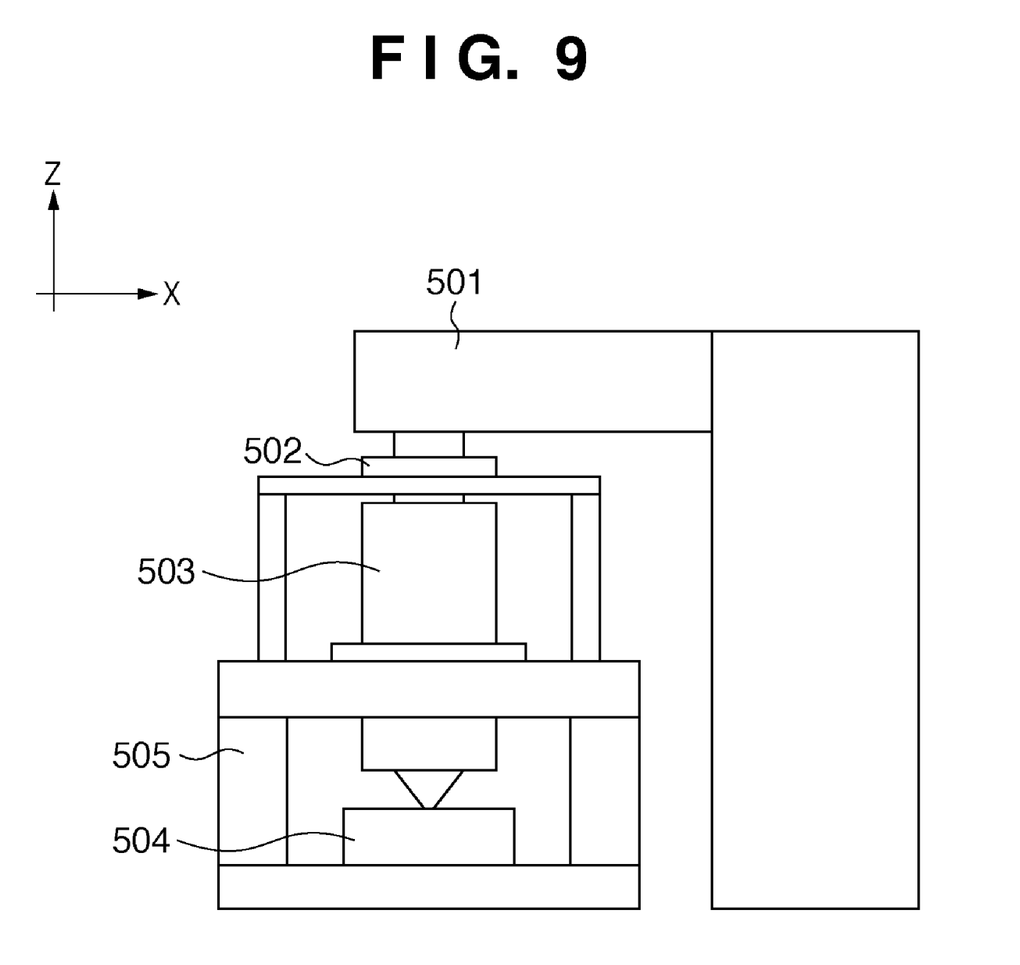
FIG. 9 is a view showing the arrangement of an exposure apparatus of the third embodiment.

As shown in FIG. 9, the exposure apparatus comprises an illumination device 501, a reticle stage 502 mounted with a reticle serving as a mask (photomask), a projection optical system 503, and a wafer stage 504 mounted with a wafer. The exposure apparatus projects and exposes a circuit pattern formed on the reticle onto a wafer and employs a step and repeat projection exposure scheme or a step and scan projection exposure scheme.

The illumination device 501 illuminates a reticle on which a circuit pattern is formed and comprises a light source unit and an illumination optical system. The light source unit comprises, for example, a laser as a light source. The laser can be an ArF excimer laser with a wavelength of about 193 nm, a KrF excimer laser with a wavelength of about 248 nm, an $F_2$ excimer laser with a wavelength of about 153 nm, or the like. The type of laser is not limited to an excimer laser, but a YAG laser is usable. The number of lasers is not limited to a specific one. When the light source employs a laser, a light beam shaping optical system for shaping a parallel beam from a laser source into a desired beam shape and an incoherent optical system for converting a coherent laser beam into an incoherent laser beam are preferably used. The light source usable in the light source unit is not limited to the lasers. One or a plurality of lamps, such as mercury lamps or xenon lamps, are usable. The illumination optical system is an optical system that illuminates a mask and includes a lens, a mirror, a light integrator, and a stop.

The projection optical system 503 can be an optical system that includes only a plurality of lens elements, or an optical system (catadioptric optical system) that includes a plurality of lens elements and at least one concave mirror. The projection optical system 503 may be an optical system that includes a plurality of lens elements and a diffraction optical element (e.g., a kinoform), a total mirror type optical system, or the like.

The reticle stage 502 and the wafer stage 504 are movable by, for example, a linear motor. In the step and scan projection exposure scheme, these stages move in synchronism with each other. At least one of the wafer stage and the reticle stage includes a discrete actuator to align the reticle pattern onto the wafer. The positioning apparatus of the above embodiment is applicable to at least one of the reticle stage 502 and the wafer stage 504.

The above exposure apparatus is usable for the manufacture of a semiconductor device, such as a semiconductor integrated circuit, and a device with a fine pattern, such as a micromachine and a thin-film magnetic head.

The device manufacturing method of the embodiment of the present invention is suitable for manufacturing a device, such as a semiconductor device and a liquid crystal device. This device manufacturing method can include a step of exposing a substrate applied with a photoresist to radiant energy using the above exposure apparatus, a step of developing the substrate exposed in the exposing step, and other known steps of processing the developed substrate in order to manufacture the device.

While the present invention has been described with reference to exemplary embodiments, it is to be understood that the invention is not, limited to the disclosed exemplary embodiments. The scope of the following claims is to be accorded the broadest interpretation so as to encompass all such modifications and equivalent structures and functions.

What is claimed is:

1. A positioning apparatus comprising:
   a stage movable on a base;
   an actuator which drives said stage;
   a driver which supplies current to said actuator;
   a current supply path having a plurality of parallel paths connecting said driver and said actuator, wherein said current supply path includes a plurality of forward electrical wires and a plurality of backward electrical wires; and
   a detector which detects a break of said current supply path based on a current of at least one of the plurality of parallel paths, wherein said detector detects the break of said current supply path based on a total current of at least one of said plurality of forward electrical wires and at least one of said plurality of backward electrical wires.

2. A positioning apparatus comprising:
   a stage movable on a base;
   an actuator which drives said stage;
   a driver which supplies current to said actuator;
   a current supply path having a plurality of parallel paths connecting said driver and said actuator; and a detector which detects a break of said current supply path based on a current of at least one of the plurality of parallel paths, wherein said actuator includes a stator arranged on the base and a movable element arranged on said stage, and said current supply path connects said movable element and said driver, and wherein said movable element includes a three-phase motor in which three phase motor coils are star-connected, said current supply path includes three electrical wires which connect said driver and the respective motor coils of said three-phase motor, each of said three electrical wires including a plurality of paths, and said detector detects the break of said current supply path based on a total current value of at least one path selected from each of said three electrical wires.

3. The apparatus according to claim 2, wherein said movable element includes a coil, said stator includes a magnet, and said current supply path connects said driver and said coil.

4. The apparatus according to claim 3, further comprising:
a braking circuit which generates a braking force that is applied to the movable element using a counter-electromotive force by electromagnetic induction generated in said coil by short-circuiting said coil,
wherein said braking circuit is disposed between said driver and said coil, and
wherein said current supply path includes a first current supply path which connects said driver and said braking circuit, and a second current supply path which connects said braking circuit and said coil.

5. A positioning apparatus comprising:
a stage movable on a base;
an actuator which drives said stage;
a driver which supplies current to said actuator;
an electrical wire which connects said driver and said actuator, said electrical wire having a plurality of parallel paths between said driver and said actuator, and said electrical wire including a plurality of forward electrical wires and a plurality of backward electrical wires; and
a detector which detects current flowing through at least one path of the plurality of parallel paths, said detector detecting a total current of at least one of said plurality of forward electrical wires and at least one of said plurality of backward electrical wires.

6. The apparatus according to claim 5, wherein (i) said actuator includes a stator and a movable element including said stage, (ii) said movable element includes a coil, and (iii) said electrical wire connects said coil and said driver.

7. The apparatus according to claim 6, further comprising a braking circuit which generates a braking force that is applied to the movable element using a counter-electromotive force by electromagnetic induction generated in said coil by short-circuiting said coil,
wherein said braking circuit is disposed between said driver and said coil,
and wherein said electrical wire includes a first electrical wire which connects said driver and said braking circuit, and a second electrical wire which connects said braking circuit and said coil.

8. A positioning apparatus comprising:
a stage movable on a base;
an actuator which drives said stage;
a driver which supplies current to said actuator;
a current supply path having a plurality of parallel paths connecting said driver and said actuator; and
a detector which detects a break of said current supply path based on a current of at least one of the plurality of parallel paths, wherein said actuator includes a stator arranged on said base and a movable element arranged on said stage, and said current supply path connects said movable element and said driver, and wherein said movable element includes a three-phase motor in which three phase motor coils are star-connected, said current supply path includes three electrical wires which connect said driver and the respective motor coils of said three-phase motor, each of said three electrical wires includes a plurality of paths, and said detector detects a total current value of at least one path selected from each of said three electrical wires.

9. An exposure apparatus for projecting and exposing a pattern of a reticle placed on a reticle stage onto a wafer placed on a wafer stage, the exposure apparatus comprising a positioning apparatus which positions at least one of the reticle stage and the wafer stage, said positioning apparatus including:
a stage movable on a base;
an actuator which drives said stage;
a driver which supplies current to said actuator;
a current supply path having a plurality of parallel paths connecting said driver and said actuator, wherein said current supply path includes a plurality of forward electrical wires and a plurality of backward electrical wires; and
a detector which detects a break of said current supply path based on a current of at least one of the plurality of parallel paths, wherein said detector detects the break of said current supply path based on a total current of at least one of said plurality of forward electrical wires and at least one of said plurality of backward electrical wires.

10. A method of manufacturing a device, said method comprising the steps of:
(a) exposing a pattern of a reticle onto a wafer using an exposure apparatus; and
(b) developing the exposed wafer,
the exposure apparatus including a positioning apparatus which positions at least one of the reticle and the wafer, the positioning apparatus including:
(i) a stage movable on a base;
(ii) an actuator which drives the stage;
(iii) a driver which supplies a current to the actuator;
(iv) a current supply path having a plurality of parallel paths connecting the driver and the actuator, wherein the current supply path includes a plurality of forward electrical wires and a plurality of backward electrical wires; and
(v) a detector which detects a break of the current supply path based on a current of at least one of the plurality of parallel paths, wherein the detector detects the break of the current supply path based on a total current of at least one of the plurality of forward electrical wires and at least one of the plurality of backward electrical wires.

11. An exposure apparatus for projecting and exposing a pattern of a reticle placed on a reticle stage onto a wafer placed on a wafer stage, the exposure apparatus comprising:
a positioning apparatus which positions at least one of the reticle stage and the wafer stage, said positioning apparatus including:
an actuator which drives said at least one stage;
a driver which supplies current to said actuator;
an electrical wire which connects said driver and said actuator, said electrical wire having a plurality of parallel paths between said driver and said actuator, said electrical wire including a plurality of forward electrical wires and a plurality of backward electrical wires; and
a detector which detects current flowing through at least one path of the plurality of parallel paths, said detector detecting a total current of at least one of said plurality of forward electrical wires and at least one of said plurality of backward electrical wires.

12. A method of manufacturing a device, said method comprising the steps of:
   (a) exposing a pattern of a reticle onto a wafer using an exposure apparatus; and
   (b) developing the exposed wafer,
   the exposure apparatus including a positioning apparatus which positions a stage on which at least one of the reticle and the wafer is mounted,
   the positioning apparatus including:
      (i) an actuator which drives the stage;
      (ii) a driver which supplies current to the actuator;
      (iii) an electrical wire which connects the driver and the actuator, the electrical wire having a plurality of parallel paths between the driver and the actuator, the electrical wire including a plurality of forward electrical wires and a plurality of backward electrical wires; and
      (iv) a detector which detects current flowing through at least one path of the plurality of parallel paths, the detector detecting a total current of at least one of the plurality of forward electrical wires and at least one of the plurality of backward electrical wires.

13. An exposure apparatus for projecting and exposing a pattern of a reticle placed on a reticle stage onto a wafer placed on a wafer stage, the exposure apparatus comprising:
   a positioning apparatus which positions at least one of the reticle stage and the wafer stage, said positioning apparatus including:
   a stage movable on a base;
   an actuator which drives said stage;
   a driver which supplies current to said actuator;
   a current supply path having a plurality of parallel paths connecting said driver and said actuator; and
   a detector which detects a break of said current supply path based on a current of at least one of the plurality of parallel paths,
   wherein said actuator includes a stator arranged on the base and a movable element arranged on said stage, and said current supply path connects said movable element and said driver, and
   wherein said movable element includes a three-phase motor in which three phase motor coils are star-connected, said current supply path includes three electrical wires which connect said driver and the respective motor coils of said three-phase motor, each of said three electrical wires including a plurality of paths, and
   said detector detects the break of said current supply path based on a total current value of at least one path selected from each of said three electrical wires.

14. A method of manufacturing a device, said comprising the steps of:
   (a) exposing a pattern of a reticle onto a wafer using an exposure apparatus; and
   (b) developing the exposed wafer,
   the exposure apparatus including a positioning apparatus which positions at least one of the reticle and the wafer, the positioning apparatus including:
      (i) a stage movable on a base;
      (ii) an actuator which drives the stage;
      (iii) a driver which supplies current to the actuator;
      (iv) a current supply path having a plurality of parallel paths connecting the driver and the actuator; and
      a detector which detects a break of the current supply path based on a current of at least one of the plurality of parallel paths,
   wherein the actuator includes a stator arranged on the base and a movable element arranged on the stage, and the current supply path connects the movable element and the driver,
   wherein the movable element includes a three-phase motor in which three phase motor coils are star-connected, the current supply path includes three electrical wires which connect the driver and the respective motor coils of the three-phase motor, each of the three electrical wires including a plurality of paths, and the detector detects the break of the current supply path based on a total current value of at least one path selected from each of the three electrical wires.

15. An exposure apparatus for projecting and exposing a pattern of a reticle placed on a reticle stage onto a wafer placed on a wafer stage, the exposure apparatus comprising:
   a positioning apparatus which positions at least one of the reticle stage and the wafer stage, said positioning apparatus including:
   a stage movable on a base;
   an actuator which drives said stage;
   a driver which supplies current to said actuator;
   a current supply path having a plurality of parallel paths connecting said driver and said actuator; and
   a detector which detects a break of said current supply path based on a current of at least one of the plurality of parallel paths,
   wherein said actuator includes a stator arranged on the base and a movable element arranged on said stage, and said current supply path connects said movable element and said driver,
   wherein said movable element includes a three-phase motor in which three phase motor coils are star-connected, said current supply path includes three electrical wires which connect said driver and the respective motor coils of said three-phase motor, each of said three electrical wires including a plurality of paths, and said detector detects a total current value of at least one path selected from each of said three electrical wires.

16. A method of manufacturing a device, said method comprising the steps of:
   (a) exposing a pattern of a reticle onto a wafer using an exposure apparatus; and
   (b) developing the wafer,
   the exposure apparatus including a positioning apparatus which positions at least one of the reticle and the wafer, the positioning apparatus including:
      (i) a stage movable on a base;
      (ii) an actuator which drives the stage;
      (iii) a driver which supplies current to the actuator;
      (iv) a current supply path having a plurality of parallel paths connecting the driver and the actuator; and
      a detector which detects a break of the current supply path based on a current of at least one of the plurality of parallel paths,
   wherein the actuator includes a stator arranged on the base and a movable element arranged on the stage, and the current supply path connects the movable element and the driver, and
   wherein the movable element includes a three-phase motor in which three phase motor coils are star-connected, the current supply path includes three electrical wires which connect the driver and the respective motor coils of the three-phase motor, each of the three electrical wires includes a plurality of paths, and the detector detects a break of the current supply path based on a total current value of at least one path selected from each of the three electrical wires.

* * * * *